United States Patent
Zimmerman

(10) Patent No.: US 9,206,499 B2
(45) Date of Patent: Dec. 8, 2015

(54) MINIMIZING BLOCKAGE OF HOLES IN TURBINE ENGINE COMPONENTS

(75) Inventor: Benjamin Joseph Zimmerman, Enfield, CT (US)

(73) Assignee: United Technologies Corporation, Hartford, CT (US)

( * ) Notice: Subject to any disclaimer, the term of this patent is extended or adjusted under 35 U.S.C. 154(b) by 110 days.

(21) Appl. No.: 12/871,028

(22) Filed: Aug. 30, 2010

(65) Prior Publication Data

US 2012/0052200 A1 Mar. 1, 2012

(51) Int. Cl.
| F01D 5/18 | (2006.01) |
| C23C 4/00 | (2006.01) |
| C23C 4/02 | (2006.01) |
| C23C 4/12 | (2006.01) |
| C23C 14/04 | (2006.01) |
| F01D 5/28 | (2006.01) |

(52) U.S. Cl.
CPC . *C23C 4/005* (2013.01); *C23C 4/02* (2013.01); *C23C 4/12* (2013.01); *C23C 4/128* (2013.01); *C23C 14/042* (2013.01); *F01D 5/186* (2013.01); *F01D 5/288* (2013.01); *F05D 2230/312* (2013.01); *F05D 2250/70* (2013.01); *F05D 2300/13* (2013.01); *F05D 2300/21* (2013.01)

(58) Field of Classification Search
None
See application file for complete search history.

(56) References Cited

U.S. PATENT DOCUMENTS

| 1,647,090 | A | 10/1927 | Globus |
| 2,324,568 | A | 7/1943 | Duggan |
| 2,363,660 | A | 11/1944 | Duggan |
| 2,583,533 | A | 1/1952 | Hiensch |
| 3,196,043 | A | 7/1965 | Harris et al. |
| 3,380,863 | A | 4/1968 | Silberberg |
| 3,565,664 | A | 2/1971 | Al |
| 3,667,988 | A | 6/1972 | Horiki |
| 3,695,340 | A | 10/1972 | Gross |
| 3,972,974 | A | 8/1976 | Pico |
| 4,115,507 | A | 9/1978 | Pico et al. |
| 4,128,522 | A | 12/1978 | Elam |
| 4,170,513 | A * | 10/1979 | Piche ............................ 216/108 |
| 4,264,647 | A | 4/1981 | Trevorrow |
| 4,396,503 | A | 8/1983 | Schmidt |
| 4,402,992 | A | 9/1983 | Liebert |
| 4,479,890 | A | 10/1984 | Prabhu et al. |

(Continued)

FOREIGN PATENT DOCUMENTS

| DE | 102006029071 | 12/2006 |
| EP | 0253754 | 1/1988 |

(Continued)

OTHER PUBLICATIONS

Bessman et al., "Chemically Vapor Deposited YSZ for Thermal and Environmental Barrier Coatings", Conference Proceedings: 16th Annual Conference on Fossil Energy Materials, NETL Publications, (2002).*

(Continued)

*Primary Examiner* — Lisha Jiang
(74) *Attorney, Agent, or Firm* — Carlson, Gaskey & Olds, PC

(57) ABSTRACT

An airfoil for use in a gas turbine engine is provided, the airfoil having a hole therein. A ceramic plug is inserted in the hole so that the plug extends above a depth of a thermal barrier coating, such as a ceramic, to be placed on the airfoil. The airfoil is then coated by non-line of sight vapor deposition and the plugs are then removed.

3 Claims, 3 Drawing Sheets

(56) References Cited

U.S. PATENT DOCUMENTS

| | | | |
|---|---|---|---|
| 4,518,635 A | | 5/1985 | Schnedecker et al. |
| 4,530,861 A | | 7/1985 | Sippel et al. |
| 4,743,462 A | | 5/1988 | Radzavich et al. |
| 4,762,028 A | * | 8/1988 | Regan ............... 76/108.2 |
| 4,871,585 A | * | 10/1989 | Kano et al. ............ 427/98.5 |
| 5,304,331 A | | 4/1994 | Leonard et al. |
| 5,385,761 A | | 1/1995 | Iwanaga |
| 5,441,767 A | | 8/1995 | DeSaulniers |
| 5,468,681 A | | 11/1995 | Pasch |
| 5,726,348 A | | 3/1998 | Draghi et al. |
| 5,800,695 A | | 9/1998 | Kang et al. |
| 5,902,647 A | | 5/1999 | Venkataramani et al. |
| 5,985,122 A | | 11/1999 | Conner |
| 6,004,620 A | | 12/1999 | Camm |
| 6,018,856 A | * | 2/2000 | Ehrhart ............... 29/235 |
| 6,161,804 A | * | 12/2000 | Paske et al. ............ 248/74.1 |
| 6,265,022 B1 | * | 7/2001 | Fernihough et al. ...... 427/142 |
| 6,335,078 B2 | | 1/2002 | Venkataramani et al. |
| 7,083,824 B2 | | 8/2006 | Stankowski et al. |
| 7,192,622 B2 | | 3/2007 | Fernihough et al. |
| 7,658,590 B1 | | 2/2010 | Spanks |
| 2001/0009247 A1 | * | 7/2001 | Brooks ............... 216/34 |
| 2002/0155941 A1 | * | 10/2002 | Hokkirigawa et al. ...... 501/99 |
| 2004/0047992 A1 | * | 3/2004 | Donelon ............... 427/282 |
| 2004/0048003 A1 | | 3/2004 | Jeutter et al. |
| 2004/0058070 A1 | * | 3/2004 | Takeuchi et al. ............ 427/282 |

FOREIGN PATENT DOCUMENTS

| | | |
|---|---|---|
| EP | 0510740 A1 | 3/1992 |
| EP | 0843026 A1 | 5/1998 |
| EP | 1835045 | 9/2007 |
| WO | 9923274 | 5/1999 |
| WO | WO9923273 | 5/1999 |

OTHER PUBLICATIONS

DVTI, "Coating Technology for the Future", Directed Vapor Technologies International Inc., (2008).*

Extended European Search Report received Nov. 15, 2011.

* cited by examiner

MINIMIZING BLOCKAGE OF HOLES IN TURBINE ENGINE COMPONENTS

FIELD

The present invention relates to a method for minimizing blockage of holes in turbine engine components such as blades or vanes during the application of plasma spray coatings.

BACKGROUND

The use of hollow, air-cooled blades and vanes (hereinafter referred to collectively as "airfoils") is common in modern gas turbine engines. During engine operation, air is flowed into an internal cavity of the airfoils and is discharged through cooling holes present in a section of the airfoil, its platform and/or tip thereof. The passage of air through the airfoil extracts heat from the airfoil surface allowing use of the airfoil even if gas stream temperatures exceed the melting temperature of the alloy from which the airfoil is made. Obstruction of the cooling holes can result in hot spots on the airfoil that may cause cracking or localized melting of the airfoil, and/or degradation of a protective coating that may be present on the airfoil surface.

In the plasma spray coating process, powders may be injected into a high temperature high velocity stream of ionized gases. At the point where the powders are injected into the gas stream, the temperatures can be very high. As a result, the powders are typically molten when they strike the substrate surface.

If coatings are sprayed onto air cooled airfoils, cooling holes can become filled with coating material, requiring a subsequent machine operation to open the holes. This is not only time consuming and therefore expensive, but locating the exact position of each hole is difficult. One known method uses a high pressure stream of gas that is flowed into the internal cavity of the airfoil during the coating operation. The gas is discharged through the cooling holes to deflect the incoming coating particles away from the holes, thereby keeping the holes open. Unless gas is discharged evenly through each of the holes, some holes are still likely to become plugged. A common practice is to drill the holes after coating is applied.

According to a further methodology, plugs are inserted into the cooling holes of hollow, air cooled airfoils prior to the plasma spray coating operation. The plugs are ablative and the plasma spray stream causes a portion of the head of each plug to volatilize during the spray operation. The plugs are sized to provide a sufficient amount of material that can be sacrificed during the spray operation so that at the end of the operation, the plug heads continue to protrude above the surface of the coating. The plugs are removed from the coated component by heating the component at elevated temperatures for a time sufficient to cause complete volatilization to open up the holes.

Sometimes the holes are welded shut before coating is applied, and then are drilled out after the coating process. All such techniques are expensive and time consuming; therefore, improved techniques are desired.

SUMMARY

According to an exemplar method for coating an airfoil disclosed herein, an airfoil, the airfoil having a hole therein. A ceramic plug is inserted in the hole so that the plug extends above a depth of a thermal barrier coating, such as a ceramic, to be placed on the airfoil. The airfoil is then coated by a substantially non-line of sight vapor deposition and the plugs are then removed.

According to another exemplar method for coating an airfoil disclosed herein, an airfoil has a hole therein. A plug is manipulated to fit within the hole, wherein the plug extends above a depth of a ceramic coating to be placed on the airfoil. The airfoil is coated by non-line of sight vapor deposition, and then the plug is removed by manipulating the plug.

According to a further exemplar method for coating an airfoil disclosed herein, an airfoil has a hole therein. A refractory metal plug is inserted in the hole, wherein the plug extends above a depth of a ceramic coating to be placed on the airfoil. The airfoil is coated by non-line of sight vapor deposition, and then the plug is removed.

According to a still further exemplar method for coating an airfoil disclosed herein, an airfoil has a hole therein. A plug constructed of a material having a greater coefficient of thermal expansion than the nickel blade in the hole is inserted in the hole, wherein the plug extends above a depth of a ceramic coating to be placed on the airfoil. The airfoil is coated by non-line of sight vapor deposition, and then the plug is removed.

These and other features of the disclosed examples can be best understood from the following specification and drawings, the following of which is a brief description.

DETAILED DESCRIPTION

Figure 1:
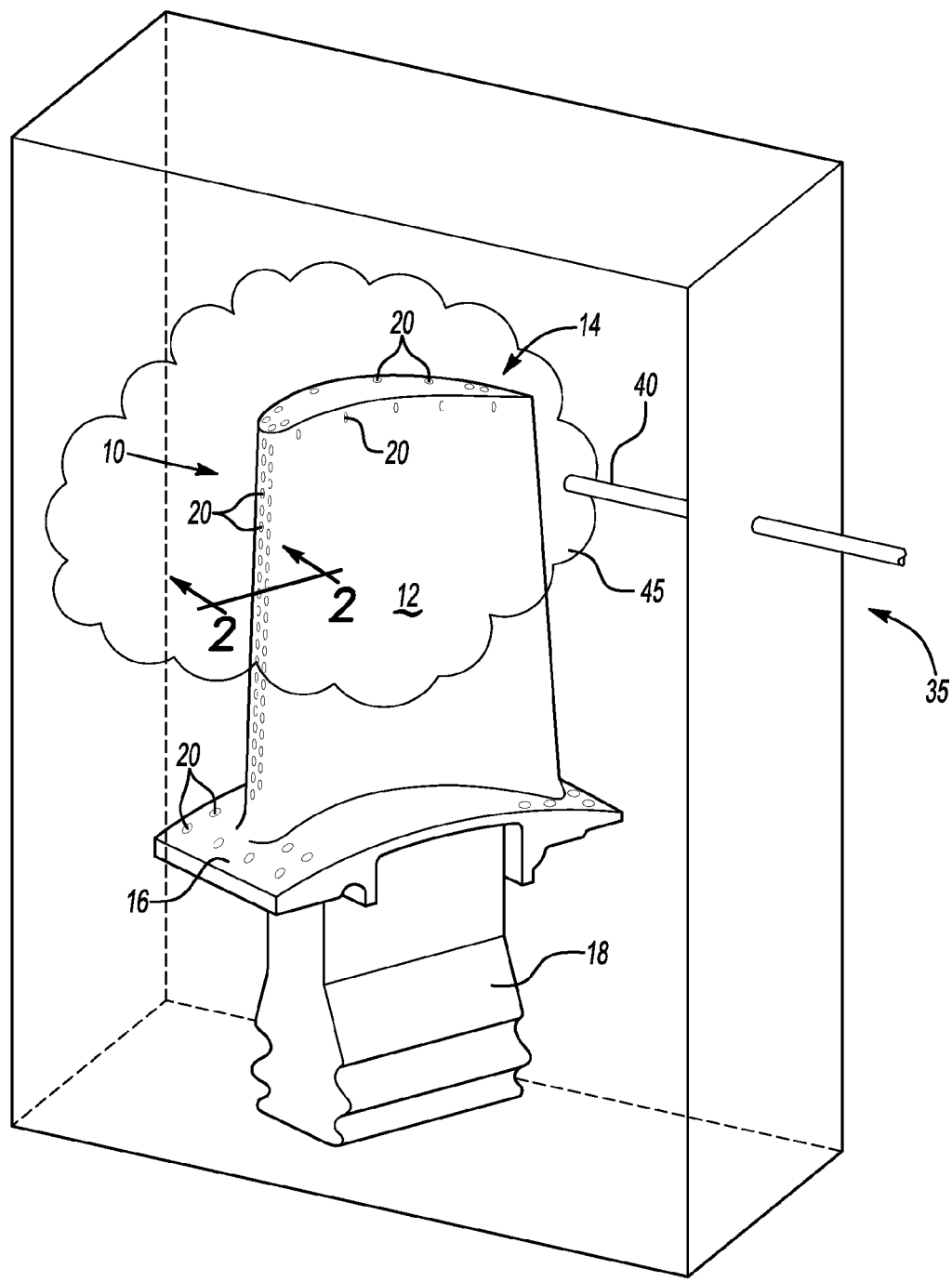
FIG. 1 is a perspective view of an airfoil used in a modern gas turbine engine.

FIG. 1 is a view of an airfoil 10 having an airfoil section 12, a tip section 14, a platform section 16 and a root section 18. Because a turbine engine vane (not shown) has a similar airfoil section 12, the term "airfoil" is meant to mean blade as well as a vane or other surface that is be air cooled. Airfoil 10 has cooling holes 20 that are dictated by the particular operating characteristics and cooling requirements of the airfoil 10 and engine (not shown). The number, size and location of the holes 20 shown in FIG. 1 is meant to be illustrative of the use of the invention is not intended as limiting the scope of the invention.

Figure 2:
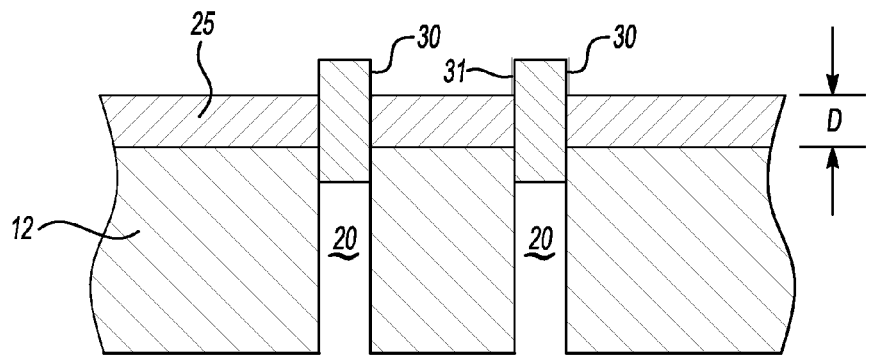
FIG. 2 shows a portion of the surface of the airfoil of FIG. 1 taken along the line 2-2.

Maintaining cooling holes 20 in an unobstructed condition as well as keeping the size and shape of the holes 20 within design limits is essential to achieve desired performance of the airfoil 10 during engine operation. A coating 25 (see FIG. 2), such as a ceramic (as will be discussed more in depth hereinbelow), that is applied to the airfoil 10 can affect the condition of the cooling holes.

The airfoil section 12 is shown schematically in FIG. 1 as being disposed within a physical vapor deposition chamber ("PVD") 35. The airfoil shown herein is a constructed of a nickel-based material and is placed in the PVD chamber for the deposition of a ceramic coating of material to protect the airfoil from the rigors of heat encountered in the combustion section of a gas turbine engine (not shown). The coating 25 may minimize the effects of higher temperatures the nickel airfoil 10 encounters within the gas turbine engine. The coating 25 may also be known as a thermal barrier coating ("TBC"). Other airfoil materials that are coated are contemplated herein.

Current techniques, including conventional Electron Beam PVD techniques, used to coat turbine airfoils 12 with thermal barrier coatings are typically line-of-sight. These coating techniques offer limited capability to go in deeply concave or other hidden or complex surfaces. As a result, the achievable coating thickness is limited and coating distribution is inconsistent on complexly-shaped parts. Moreover, more conventional line-of-sight PVD techniques are infrequently focused long enough on a particular hole 20 to cause significant clogging with coating 25.

However, non-line of sight technologies ("NLOS") are being developed that allow for coating on complex shaped parts such as airfoil 10. For instance, a transonic gas jet 40 directs and transports a thermally evaporated vapor cloud 45 into and around an airfoil 10 to reach deeply concave or other hidden or complex surfaces of the airfoil uniformly. Collisions between the vapor atoms and gas jet create a mechanism for controlling vapor transport. The probability of clogging of holes 20 is much higher in such a system.

According to an example herein, plugs 30 are inserted into holes 20, stick in place therein, survive the higher temperature PVD chamber 35 environment and are relatively easy to get out. The plug 25 could be any ceramic such as a 7% yttria stabilized zirconia or a gadolinia zirconia or any other appropriate combination of zirconia with a rare earth oxide such as dysprosia. The plugs 30 can also be a zirconia based ceramic powder mixed with binder, such as a polymer, a wax, or the like etc. The plugs may also be any high temperature metal that is coated with a lamina 31, which may be ceramic slurry. The plug 30 may also be made of a material, such as cobalt based alloys or austenitic stainless steel, having a higher coefficient of thermal expansion than the airfoil section 12 so that heating of the airfoil section 12 causes the plug 30 to tightly fit within the hole 20 during processing and cooling makes the plugs 30 easy to remove. The plugs may also be formed of ceramic slurry. The plugs may also be coated with a ceramic powder 31.

Figure 3:
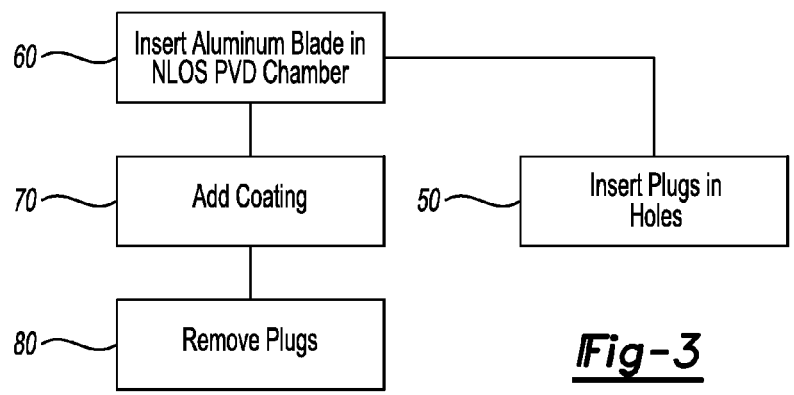
FIG. 3 shows a method of protecting holes in the airfoil of FIG. 1.
Figure 4:
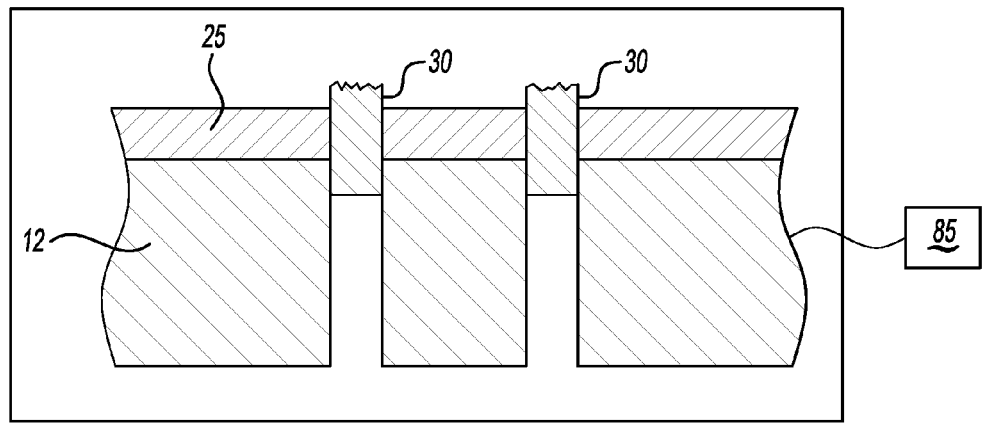
FIG. 4 shows a removal of the plugs of FIG. 2.

Referring now to FIGS. 3 and 4, a method of processing a airfoil 10 is described as follows: plugs 30 are inserted in the holes 20 such that they extend beyond a coating depth D (step 50) (see FIG. 2), the airfoil 10 is inserted in the NLOS ("non-line of sight") PVD chamber (step 60), processed (step 70) in the NLOS PVD chamber 35, and the plugs 30 are removed (step 80) by vibrating the airfoil by a vibrator (shown schematically 85) which minimizes or destroys the integrity of the plugs causing them to fall away, by placing them in an oven and burning the plugs 30 away, or by removing them physically. The plugs may be burned away if they are made of a refractory material, such as zirconium, titanium, molybdenum, halfnium, tantalum or tungsten, or the like, that would react with oxygen when heated in air. Zirconium would be a good choice because the PVD chamber 35 would not be contaminated if the plug fell out during processing of the airfoil section 12.

Figure 5:
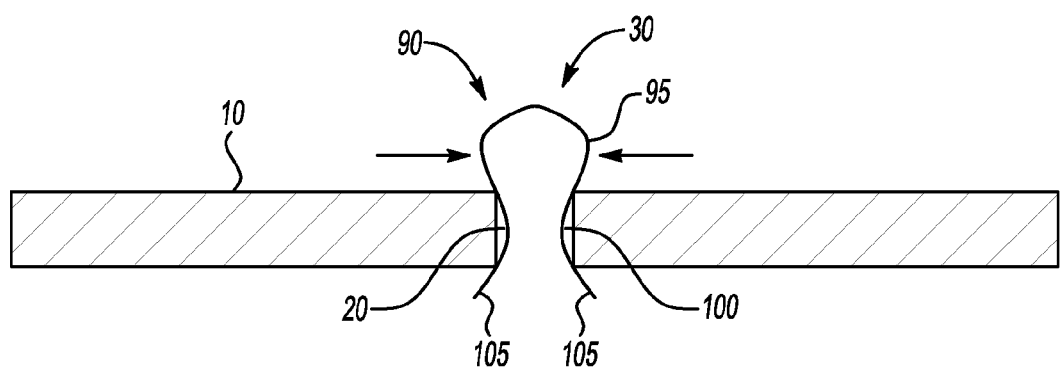
FIG. 5 is a cross-sectional view of a further embodiment of a plug.

Referring to FIG. 5, a plug 30 has a squeezable shape 90, like an omega, though other shapes may be used herein, having a bulbous top 95, a narrow body 100 and splayed legs 105 from the narrow body 100. If the bulbous top 95 is squeezed or manipulated, the legs 105 move toward each other allowing them room to fit within the holes 20. If the bulbous top is released from squeezing, the legs 105 move outwardly trapping the narrow body 100 in the hole between the bulbous top 95 and the legs. After coating the process is reversed, the bulbous top 95 is squeezed causing the legs 105 to move toward each other allowing them room to be removed from the holes 20.

Although a combination of features is shown in the illustrated examples, not all of them need to be combined to realize the benefits of various embodiments of this disclosure. In other words, a system designed according to an embodiment of this disclosure will not necessarily include all of the features shown in any one of the Figures or all of the portions schematically shown in the Figures. Moreover, selected features of one example embodiment may be combined with selected features of other example embodiments.

The preceding description is exemplary rather than limiting in nature. Variations and modifications to the disclosed examples may become apparent to those skilled in the art that do not necessarily depart from the essence of this disclosure. Thus, the scope of legal protection given to this disclosure can only be determined by studying the following claims.

I claim:

1. A method for coating an airfoil, said method comprising: providing an airfoil, said airfoil having a hole therein, inserting a plug in said hole, wherein said plug is an omega-shaped plug and said insertion step includes extending the omega-shaped plug in said hole such that a bulbous top of said plug extends above a depth of a ceramic coating to be placed on said airfoil,
coating said airfoil by a non-line of sight physical vapor deposition, and
removing said plug.

2. The method of claim 1 wherein said insertion step includes squeezing said bulbous top of said omega-shaped plug,
inserting said plug in said hole, and
releasing said bulbous top of said omega-shaped plug to trap a body of said airfoil between legs of said omega-shaped plug and said bulbous top.

3. The method of claim 1 wherein said removing step includes squeezing said bulbous top of said omega-shaped plug to release said plug from said body of said airfoil.

* * * * *